(12) United States Patent
Zhang

(10) Patent No.: US 11,795,386 B2
(45) Date of Patent: Oct. 24, 2023

(54) METHOD FOR PATTERNING NANOPARTICLE LAYER, QUANTUM DOT LIGHT EMITTING DEVICE AND DISPLAY DEVICE ALL FEES

(71) Applicant: BOE TECHNOLOGY GROUP CO., LTD., Beijing (CN)

(72) Inventor: Zhenqi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 680 days.

(21) Appl. No.: 16/980,814

(22) PCT Filed: Apr. 16, 2020

(86) PCT No.: PCT/CN2020/085093
§ 371 (c)(1),
(2) Date: Sep. 14, 2020

(87) PCT Pub. No.: WO2020/228476
PCT Pub. Date: Nov. 19, 2020

(65) Prior Publication Data
US 2021/0253948 A1    Aug. 19, 2021

(30) Foreign Application Priority Data
May 16, 2019 (CN) .......................... 201910405886.0

(51) Int. Cl.
*B82Y 20/00* (2011.01)
*B82Y 30/00* (2011.01)
(Continued)

(52) U.S. Cl.
CPC .............. *C09K 11/06* (2013.01); *B82Y 20/00* (2013.01); *B82Y 30/00* (2013.01); *B82Y 40/00* (2013.01);
(Continued)

(58) Field of Classification Search
CPC ......... B82Y 20/00; B82Y 30/00; B82Y 40/00; H10K 50/115
See application file for complete search history.

(56) References Cited

U.S. PATENT DOCUMENTS

| 2006/0217492 A1 | 9/2006 | Mizusaki et al. |
| 2017/0176863 A1 | 6/2017 | Zhang et al. |

(Continued)

FOREIGN PATENT DOCUMENTS

| CN | 1613157 A | 5/2005 |
| CN | 105098002 A | 11/2015 |

(Continued)

OTHER PUBLICATIONS

ISA China National Intellectual Property Administration, International Search Report and Written Opinion Issued in Application No. PCT/CN2020/085093, dated Jul. 15, 2020, WIPO, 16 pages. (Submitted with Partial Translation).

(Continued)

*Primary Examiner* — Daniel P Shook
(74) *Attorney, Agent, or Firm* — McCoy Russell LLP

(57) ABSTRACT

The present disclosure provides a method for patterning a nanoparticle layer, including steps of: (S1) connecting a first base to a surface of a predetermined area of a substrate, to form a substrate modified with the first base in the predetermined area of the substrate; (S2) depositing the nanoparticle in the predetermined area of the substrate, to form a nanoparticle layer in the predetermined area of the substrate by self-assembling, a ligand of the nanoparticle includes a second base, and the first base and the second base being connected by a hydrogen bond; and (S3) removing the nanoparticle in a non-predetermined area of the substrate.

20 Claims, 1 Drawing Sheet

(51) Int. Cl.
*B82Y 40/00* (2011.01)
*H10K 50/115* (2023.01)
*H10K 71/00* (2023.01)
*C09K 11/06* (2006.01)
*H10K 50/15* (2023.01)
*H10K 50/16* (2023.01)

(52) U.S. Cl.
CPC ............... *C09K 2211/1048* (2013.01); *C09K 2211/1074* (2013.01); *H10K 50/115* (2023.02); *H10K 50/15* (2023.02); *H10K 50/16* (2023.02); *H10K 71/00* (2023.02)

(56) References Cited

U.S. PATENT DOCUMENTS

| | | |
|---|---|---|
| 2018/0062101 A1 | 3/2018 | Ll et al. |
| 2018/0108841 A1 | 4/2018 | Li et al. |
| 2018/0108842 A1 | 4/2018 | Li et al. |
| 2019/0131587 A1 | 5/2019 | Chen |
| 2019/0207136 A1* | 7/2019 | Chen ................ C09K 11/07 |
| 2019/0296241 A1 | 9/2019 | Chen et al. |
| 2020/0127219 A1 | 4/2020 | Chen et al. |

FOREIGN PATENT DOCUMENTS

| | | |
|---|---|---|
| CN | 105449111 A | 3/2016 |
| CN | 105514302 A | 4/2016 |
| CN | 105552241 A | 5/2016 |
| CN | 106032468 A | 10/2016 |
| CN | 106191260 A | 12/2016 |
| CN | 107799672 A | 3/2018 |
| CN | 108447999 A | 8/2018 |
| CN | 109378395 A | 2/2019 |
| CN | 109599496 A | 4/2019 |
| CN | 110137387 A | 8/2019 |

OTHER PUBLICATIONS

China National Intellectual Property Administration, Office Action and Search Report Issued in Application No. 201910405886.0, dated Dec. 14, 2020, 10 pages. (Submitted with Partial Translation).

* cited by examiner

METHOD FOR PATTERNING NANOPARTICLE LAYER, QUANTUM DOT LIGHT EMITTING DEVICE AND DISPLAY DEVICE ALL FEES

CROSS-REFERENCE TO RELATED APPLICATION

This application is the U.S. National Phase of International Application No. PCT/CN2020/085093 filed on Apr. 16, 2020, which claims priority to Chinese Patent Application No. 201910405886.0 filed on May 16, 2019. The entire contents of each of the above-listed applications are hereby incorporated by reference for all purposes.

TECHNICAL FIELD

The present disclosure relates to the field of display, in particular, to a method for patterning a nanoparticle layer, a quantum dot light emitting device, and a display device.

BACKGROUND AND SUMMARY

With an extensive development of technology for manufacturing quantum dots, the stability and luminous efficiency of quantum dots is improved continuously, and the research on quantum dot light emitting diode (QLED) is improved continuously, and thus the application prospect of QLED in the display field is promising. However, the current generation efficiency of QLED has not yet reached the level of mass production, in which the most important reason lies in that the high-resolution patterning technology of QLED has not yet made a breakthrough.

The present disclosure provides a method for patterning a nanoparticle layer, including steps of:

(S1) connecting a first base to a surface of a predetermined area of a substrate, to form a substrate modified with the first base in the predetermined area of the substrate;

(S2) depositing the nanoparticles in the predetermined area of the substrate, to form a nanoparticle layer in the predetermined area of the substrate by self-assembling, a ligand of the nanoparticles including a second base, and the first base and the second base being connected by a hydrogen bond; and (S3) removing the nanoparticles in a non-predetermined area of the substrate.

Optionally, step (S1) specifically includes:

connecting a compound containing the first base to the predetermined area of the substrate by a printing process, a roll to roll process or a transferring process, to form a substrate modified with the first base in the predetermined area of the substrate; or connecting the compound containing the first base to the entire surface of the substrate by a coating process or an immersing process, and then removing the first base connected to the non-predetermined area of the substrate by ultraviolet irradiation, to form the substrate modified with the first base in the predetermined area of the substrate.

Optionally, the step (S3) includes: removing the nanoparticles in the non-predetermined area of the substrate by using a solvent of the nanoparticles.

Optionally, the step (S3), after removing the nanoparticle in the non-predetermined area of the substrate, further includes:

depositing a plurality of nanoparticle layers in sequence in a predetermined area, different nanoparticle layers being connected by a hydrogen bond.

Optionally, the nanoparticle layer is a quantum dot layer.

Optionally, the method specifically includes:

forming a substrate modified with the first base in a first predetermined subarea of the substrate by a printing process, a roll to roll process or a transferring process;

depositing a first quantum dot on the substrate, to form a first quantum dot layer in the first predetermined subarea of the substrate, a ligand of the first quantum dot including a second base, and the first base and the second base being connected by a hydrogen bond;

removing the first quantum dot in the non-predetermined area of the substrate;

forming a substrate modified with a third base in a second predetermined subarea of the substrate by a printing process, a roll to roll process or a transferring process;

depositing a second quantum dot on the substrate to form a second quantum dot layer in the second predetermined subarea of the substrate, a ligand of the second quantum dot including a fourth base, and the third base and the fourth base being connected by a hydrogen bond; and removing the second quantum dot in the non-predetermined area of the substrate, in which a color of light emitted by the first quantum dot is different from a color of light emitted by the second quantum dot.

Optionally, the method further includes:

forming a substrate modified with a fifth base in a third predetermined subarea of the substrate by a printing process, a roll to roll process or a transferring process;

depositing a third quantum dot on the substrate to form a third quantum dot layer in the third predetermined subarea of the substrate, a ligand of the third quantum dot including a sixth base, and the fifth base and the sixth base being connected by a hydrogen bond;

removing the third quantum dot in the non-predetermined area of the substrate;

in which a color of light emitted by the third quantum dot is different from the color of the light emitted by the first quantum dot and the color of the light emitted by the second quantum dot.

Optionally, the first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

Optionally, the first base (or the second base), the third base (or the fourth base) and the fifth base (or the sixth base) may be the same or different from each other. In the case that first base (or second base), the third base (or fourth base) and the fifth base (or sixth base) are different, the first quantum dot, the second quantum dot and the third quantum dot can be deposited simultaneously or separately. In the case that the first base (or the second base), the third base (or the fourth base) and the fifth base (or the sixth base) are same, the first quantum dot, the second quantum dot and third quantum dot are merely deposited respectively.

The present disclosure provides a method for preparing a quantum dot light emitting device, in which the quantum dot layer is prepared by the patterning method described in the above technical solution.

Optionally, the method further includes: forming an anode on a substrate; forming a hole transport layer modified with a first base on the anode, the first base being connected to a surface of a predetermined area of the hole transport layer away from the anode; depositing a quantum dot on the hole transport layer, a second group in the predetermined area of the hole transport layer being combined with the quantum dot, a ligand of the quantum dot including a second base, and the first base and the second base being connected by a hydrogen bond; removing the quantum dot in the non-predetermined area of the substrate, to form a patterned quantum dot layer; forming an electron transport layer on the quantum dot layer; and forming a cathode on the electron transport layer.

Optionally, the method further includes: forming a cathode on a substrate; forming an electron transport layer modified with a first base on the cathode, the first base being connected to a surface of a predetermined area of the electron transport layer away from the cathode; depositing a quantum dot on the electron transport layer, a second group in a predetermined area of the electron transport layer being combined with the quantum dot, a ligand of the quantum dot including a second base, and the first base and the second base being connected by a hydrogen bond; removing the quantum dot in the non-predetermined area of the substrate to form a patterned quantum dot layer; forming a hole transport layer on the quantum dot layer; and forming an anode on the hole transport layer.

The present disclosure provides a quantum dot light emitting device, including:

a substrate having a first predetermined area;

a first base connected to a surface of the first predetermined area of the substrate;

and a first quantum dot layer including a second base, the first base and the second base being connected by a hydrogen bond.

Optionally, the first predetermined area of the substrate has hydroxyl group.

Optionally, the substrate includes a hole transport layer, a surface of the hole transport layer proximate to the first quantum dot layer has hydroxyl group.

Optionally, the compound containing the first base further includes at least one of amino group, carboxyl group, polyamino group, and polycarboxyl group.

Optionally, the first base and the second base are selected from any one of A, T, G, C, dNam, d5SICS, and the first base and the second base are connected by a hydrogen bond.

Optionally, the quantum dot light emitting device further includes: a substrate having a second predetermined area; a third base connected to a surface of the second predetermined area of the substrate; a second quantum dot layer including a fourth base, the third base and the fourth base being connected by a hydrogen bond; a substrate having a third predetermined area; a fifth base connected to the surface of the third predetermined area of the substrate; and a third quantum dot layer including a sixth base, the fifth base and the sixth base being connected by a hydrogen bond, in which a color of the light emitted by the first quantum dot, a color of the light emitted by the second quantum dot and a color of the light emitted by the third quantum dot are different from each other.

Optionally, the first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

DETAILED DESCRIPTION

A quantum dot is a zero-dimensional semiconducting nanomaterial. The dimensions of the three dimensions of the quantum dot are not greater than twice the Bohr radius of the exciton of the corresponding semiconductor material. In the case that the patterned quantum dot is prepared in the related art, due to the characteristics of the inorganic nanoparticles, the patterned quantum dot cannot be produced by vapor deposition and patterning.

The related art generally uses inkjet printing to produce the patterned quantum dot, and it is difficult to achieve high resolution by using this method. In order to improve the resolution of the product, the related art uses photolithography to prepare the patterned quantum dot. Since the photolithography includes an exposure process, the exposure process easily affects the performance of the quantum dot.

In summary, the related art cannot produce a patterned high-resolution quantum dot layer. Similarly, the inorganic nanoparticles with similar properties to the quantum dot cannot form a patterned high-resolution film according to related art.

The technical problem to be solved by the present disclosure is to provide a method for patterning a nanoparticle layer, a quantum dot light emitting device, and a display device; the patterning method can form a nanoparticle layer with high resolution, and when applied to a quantum dot light emitting device can form a quantum dot layer with high resolution.

In order to better understand the present disclosure, the optional embodiments of the present disclosure will be described below in combination with Examples, but it should be understood that these descriptions are merely used to further illustrate the features and advantages of the present disclosure and are not intended to limit the present disclosure.

An embodiment of the present disclosure discloses a method for patterning a nanoparticle layer, including steps of:

(S1) connecting a first base to a surface of a predetermined area of a substrate 1-1, to form a substrate 1-1 modified with the first base in the predetermined area of the substrate 1-1;

(S2) depositing the nanoparticle 1-2 in the predetermined area of the substrate 1-1, a ligand 1-3 of the nanoparticle 1-2 including a second base, the first base and the second base being connected by a hydrogen bond, to form a nanoparticle layer in the predetermined area of the substrate 1-1 by self-assembling; and (S3) removing the nanoparticle 1-2 in a non-predetermined area of the substrate.

Figure 1:
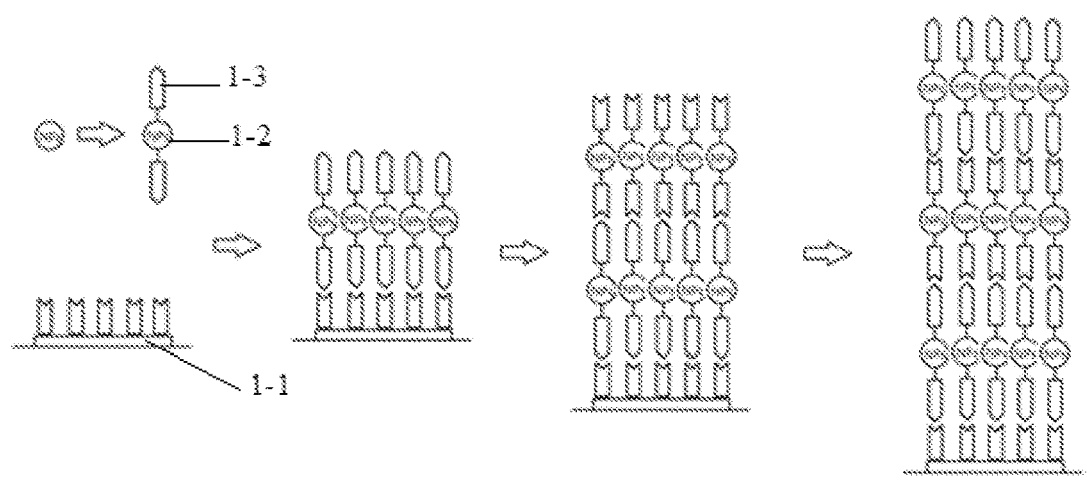
FIG. 1 is a schematic view showing the process of forming a nanoparticle layer by self-assembling of bases according to an embodiment of the present disclosure.

In the present disclosure, before the forming the nanoparticle layer, the predetermined area of the substrate 1-1 is firstly modified with the first base; then the nanoparticle layer is formed, in which the first base in the predetermined area can be connected to the second base contained in the ligand of the nanoparticles 1-2 by a hydrogen bond; in the non-predetermined area, the surface of the substrate 1-1 is not modified with the first base, and cannot be effectively connected to the ligand 1-3 of the nanoparticles 1-2 because there is substantially no bonding force; and finally, the nanoparticles 1-2 that are not involved in the connection by hydrogen bond is removed from the nanoparticle layer, thereby completing the patterning of the nanoparticle layer. See FIG. 1 for the specific principle.

The above steps are described in detail below.

(S1) connecting a first base to a surface of a predetermined area of a substrate 1-1, to form a substrate 1-1 modified with the first base.

Optionally, the step (S1) includes:

connecting a compound containing the first base to a predetermined area of the substrate 1-1, to form a substrate 1-1 modified with the first base, in which the compound containing the first base can be connected to the predetermined area of the substrate 1-1 by a printing process, a roll to roll process, a transferring process and other process; or connecting the compound containing the first base to the entire surface of the substrate 1-1 by a coating process or an immersing process, and then removing the first base connected to the non-predetermined area by ultraviolet irradiation, to form the substrate 1-1 modified with the first base.

Among them, the substrate 1-1 may be subjected to a hydroxylation treatment, and then immersed in a solution of the compound containing the first base, to connect the compound containing the first base to the surface of the substrate 1-1. The compound containing the first base also has a group capable of being connected by a hydrogen bond or a covalent bond with the hydroxyl group of the substrate, including, but not limited to, amino, carboxy, polyamino, and polycarboxy. The surface of the substrate 1-1 is divided into a predetermined area and a non-predetermined area, and the first base connected to the non-predetermined area is removed, to form the substrate 1-1 modified with the first base in the predetermined area.

The first base connected to the non-predetermined area can be removed by strong ultraviolet irradiation (organic matter is unstable and decomposes under strong ultraviolet irradiation).

(S2) depositing the nanoparticles 1-2 on the substrate 1-1, a ligand 1-3 of the nanoparticles 1-2 includes a second base, and the first base and the second base being connected by a hydrogen bond, to form a nanoparticle layer by self-assembling.

The ligand 1-3 of the nanoparticle 1-2 includes a coordination group and a second base, in which the coordination group is a group that can be connected to a quantum dot, including but not limited to mercapto group, amino, carboxy, polymercapto, polyamino, and polycarboxy. In addition to a necessary coordination group and the second base, the ligand 1-3 of the nanoparticle 1-2 may also contain other groups, e.g., a solubilizing group, such as alkyl and aryl.

In the above two steps, the first base and the second base are selected from any one of A, T, G, C, dNam, d5SICS, and the first base and the second base can be connected by a hydrogen bond.

A is adenine, T is thymine, G is guanine, C is cytosine, and dNam and d5SICS are synthetic bases, dNam is

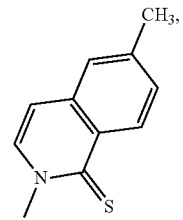

is referred to as X;

d5SICS is

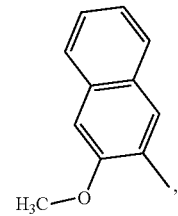

is referred to as Y

The first base and the second base can be paired with each other.

Figure 2:
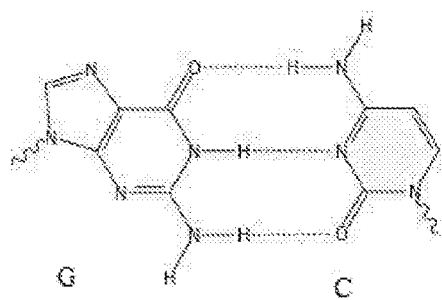
FIG. 2 is a schematic view showing the formation of the hydrogen bond between bases A and T.
Figure 3:
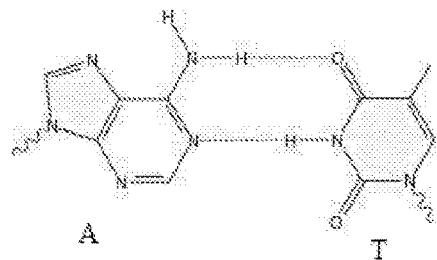
FIG. 3 is a schematic view showing the formation of the hydrogen bond between bases C and G.

For example, when the first base is A, the second base is T; and both of them can be connected by a hydrogen bond, as shown in FIG. 2. When the first base is G, the second base is C, and both of them can be connected by a hydrogen bond, as shown in FIG. 3. When the first base is dNam, the second base is d5SICS.

(S3) Removing the nanoparticles 1-2 in the non-predetermined area of the substrate, to complete the patterning of the nanoparticle layer.

Optionally, a solvent is used to remove the nanoparticles 1-2 in the non-predetermined area of the substrate.

The thickness of the nanoparticle layer can be adjusted according to actual conditions. Optionally, after the removing the nanoparticles 1-2 in the non-predetermined area of the substrate, the method further includes:

depositing a plurality of nanoparticle layers in sequence in a predetermined area, and different nanoparticle layers being connected by a hydrogen bond.

Specifically, in the adjacent nanoparticle layer, the bases carried by the nanoparticles 1-2 are paired bases with each other, to form a hydrogen bond therebetween.

In more detail, after removing the nanoparticles 1-2 in the non-predetermined area of the substrate, a nanoparticle layer containing the second base is formed. If the nanoparticle layer is required to be thicker, the following steps are subsequently performed:

for example, depositing a nanoparticles 1-2 containing the first base on the nanoparticle layer containing the second base, to form a nanoparticle layer containing the first base;

depositing a nanoparticles containing the second base 1-2 again on the nanoparticle layer containing the first base, to form a nanoparticle layer containing the second base; and repeating the above two steps, to deposit the nanoparticle layer containing the first base and the nanoparticle layer containing the second base alternately.

Optionally, the nanoparticle layer is a quantum dot layer.

That is, the embodiment of the present disclosure discloses a method for patterning a quantum dot layer, including steps of:

(S1) connecting a first base to a surface of a predetermined area of a substrate 1-1, to form a substrate 1-1 modified with the first base;

(S2) depositing a quantum dot on the substrate 1-1, a ligand of the quantum dot including a second base, and the first base and the second base being connected by a hydrogen bond, to form a quantum dot layer by self-assembling; and (S3) removing the quantum dot in the non-predetermined area of the substrate, to complete the patterning of the quantum dot layer.

The substrate 1-1 may be a glass substrate 1-1 or a glass substrate 1-1 deposited with a film layer, and the film layer is preferably a hole injection layer or an electron transport layer. The electron transport layer can be selected from oxide materials, such as zinc oxide, nickel oxide, and molybdenum oxide.

Optionally, different quantum dot layers can be formed in different predetermined areas on the substrate 1-1. Therefore, the method specifically includes:

forming the substrate 1-1 modified with the first base in the first predetermined subarea;

depositing a first quantum dot on the substrate 1-1, a ligand of the first quantum dot including a second base, and the first base and the second base being connected by a hydrogen bond, to form a first quantum dot layer; and removing the first quantum dot in the non-predetermined area of the substrate;

forming the substrate 1-1 modified with the third base in the second predetermined subarea;

depositing a second quantum dot on the substrate 1-1, a ligand of the second quantum dot including a fourth base, and the third base and the fourth base being connected by a hydrogen bond, to form a second quantum dot layer; and removing the second quantum dot in the non-predetermined area of the substrate;

in which a color of the light emitted by the first quantum dot is different from a color of the light emitted by the second quantum dot.

In specific implementation, the color of the light emitted by the first quantum dot may be red, green or blue, and the color of the light emitted by the second quantum dot may also be red, green or blue.

The first quantum dot can be repeatedly deposited in the first predetermined subarea, and the specific process is shown as follows:

after the forming the first quantum dot layer containing the second base on the substrate 1-1, depositing the first quantum dot layer containing the first base on the first quantum dot layer;

depositing the quantum dot containing the second base on the quantum dot layer containing the first base again, to form a first quantum dot layer containing the second base; and repeating the above two steps, to deposit the first quantum dot layer containing the first base and the first quantum dot layer containing the second base alternately.

The second quantum dots can be repeatedly deposited in the second predetermined subarea.

Further, in the embodiment of the present disclosure, in order to form a full-color quantum dot, the method further includes:

forming a substrate 1-1 modified with a fifth base in the third predetermined subarea;

depositing a third quantum dot on the substrate 1-1 to form a third quantum dot layer, a ligand of the third quantum dot including a sixth base, and the fifth base and the sixth base being connected by a hydrogen bond;

removing the third quantum dot in the non-predetermined area of the substrate;

in which a color of the light emitted by the third quantum dot is different from the color of the light emitted by the first quantum dot and the color of the light emitted by the second quantum dot.

Optionally, in the specific embodiment of the present disclosure, the color of the light emitted by the first quantum dot, the color of the light emitted by the second quantum dot, and the color of the light emitted by the third quantum dot are red, green, and blue, respectively. In this way, the specific embodiment of the present disclosure completes the patterning process of a full-color quantum dot through the above method. The specific embodiments of the present disclosure can complete the patterning of the quantum dot layer without using inkjet printing or photolithography, and can form a quantum dot with high resolution and good performance.

The first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

The embodiment of the present disclosure discloses a method for preparing a quantum dot light emitting device, including forming an anode, a quantum dot layer, and a cathode, in which the quantum dot layer is made by the patterning method described in the above technical solution.

Optionally, the method according to the embodiment of the present disclosure further comprises:

forming an anode on the substrate;

forming a hole transport layer modified with a first base on the anode, the first base being connected to a surface of a predetermined area of the hole transport layer away from the anode;

depositing a quantum dot on the hole transport layer, a second group in a predetermined area of the hole transport layer being combined with the quantum dot, a ligand of the quantum dot including a second base, and the first base and the second base being connected by a hydrogen bond;

removing the quantum dot in the non-predetermined area of the substrate to form a patterned quantum dot layer;

forming an electron transport layer on the quantum dot layer; and forming a cathode on the electron transport layer.

If the quantum dot light emitting device has an inverted structure, optionally, the method for preparing the quantum dot light emitting device specifically includes:

forming a cathode on the substrate;

forming an electron transport layer modified with a first base on the cathode, the first base being connected to a surface of a predetermined area of the electron transport layer away from the cathode;

depositing a quantum dot on the electron transport layer, a second group in a predetermined area of the electron transport layer being combined with the quantum dot, a ligand of the quantum dot including a second base, and the first base and the second base being connected by a hydrogen bond;

removing the quantum dot in the non-predetermined area of the substrate to form a patterned quantum dot layer;

forming a hole transport layer on the quantum dot layer; and forming an anode on the hole transport layer.

The electron transport layer is optionally made of zinc oxide. Since the surface of zinc oxide has suspended hydroxy, a compound with a silane coupling group and a first base can be used to modify the electron transport layer. After a modification reaction, the first group is connected to the surface of the electron transport layer, to form an electron transport layer modified with the first base.

An embodiment of the present disclosure also discloses a quantum dot light emitting device that is prepared by using the method for manufacturing the quantum dot light emitting device described in the above technical solution.

The quantum dot light emitting device includes: a substrate having a first predetermined area; a first base connected to the surface of the first predetermined area of the substrate; and a first quantum dot layer containing a second base, the first base and the second base being connected by a hydrogen bond.

Optionally, the first predetermined area of the substrate has hydroxyl group.

Optionally, the substrate includes a hole transport layer, a surface of the hole transport layer proximate to the first quantum dot layer has hydroxyl group.

Optionally, the compound containing the first base further has a group capable of being connected by a hydrogen bond or covalent bond with the hydroxy of the substrate. Optionally, the group capable of being connected by a hydrogen bond or covalent bond with the hydroxy of the substrate includes amino, carboxy, polyamino and polycarboxy.

Optionally, the first base and the second base are selected from any one of A, T, G, C, dNam, d5SICS, and the first base and the second base are connected by a hydrogen bond.

Optionally, the quantum dot light emitting device further includes: a substrate having a second predetermined area; a third base connected to a surface of the second predetermined area of the substrate; a second quantum dot layer including a fourth base, the third base and the fourth base being connected by a hydrogen bond; a substrate having a third predetermined area; a fifth base connected to the surface of the third predetermined area of the substrate; and a third quantum dot layer including a sixth base, the fifth base and the sixth base being connected by a hydrogen bond, in which a color of the light emitted by the first quantum dot, a color of the light emitted by the second quantum dot and a color of the light emitted by the third quantum dot are different from each other.

Optionally, the first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

The embodiments of the present disclosure further disclose a display device, including the quantum dot light emitting device described in the above technical solution.

As compared with the related art, the present disclosure can complete the patterning of the nanoparticle layer, in particular the quantum dot layer, without using inkjet printing or photolithography, and can form a nanoparticle layer with high resolution and good performance.

In order to further understand the present disclosure, the method for patterning the nanoparticle layer, the quantum dot light emitting device, and the display device provided by the present disclosure will be described in detail below in conjunction with the embodiments. The protection scope of the present disclosure is not limited by the following embodiments.

Example 1

1.1 Processing of Nanoparticles 1.1.1 The ligand containing adenine (A) was mixed with a nanoparticle solution, stirred, precipitated and centrifuged, to obtain adenine modified nanoparticles (A-NPs);

1.1.2 The ligand containing thymine (T) was mixed with a nanoparticle solution, stirred, precipitated and centrifuged, to obtain thymine modified nanoparticles (T-NPs).

1.2 Depositing of Nanoparticles 1.2.1 The substrate was chemically modified to obtain a substrate with T on its surface. The specific steps are as follows:

1) Hydroxylation of substrate: the glass substrate was soaked in a mixed washing solution of concentrated sulfuric acid and hydrogen peroxide (a ratio of concentrated sulfuric acid to hydrogen peroxide volume is 7:3), heated to 80 degrees Celsius for 5 h, and rinsed with deionized water after the reaction was completed, to obtain a hydroxylated glass substrate; 2) Chemical modification: the substrate was soaked in a toluene solution (0.5 mmol/L) containing 1H, 1H, 2H, 2H-perfluorododecyltrichlorosilane, stood for 10 min, and rinsed with toluene, to obtain a substrate containing $C_8F_{17}$ groups; and 3) Base modification: a substance containing base T and $C_8F_{17}$ was dissolved in the solution, immersed into the substrate for 10 min at room temperature, and the base T in the non-predetermined area was removed, to obtain a substrate modified with base T in the predetermined area.

1.2.2 The solution of A-NPs was coated on the surface of the substrate containing T, or the substrate containing T was soaked in the solution of A-NPs (nanoparticle has a concentration of 1 mg/mL), and stand for 10 minutes. Due to the interaction between A and T, the first layer of nanoparticle A-NPs will be deposited on the substrate; and then the substrate was taken out and cleaned to remove unadsorbed nanoparticles.

1.2.3 A solution of T-NPs was coated on the surface of the substrate deposited with A-NPs, or the substrate deposited with A-NPs was soaked in the solution of T-NPs, to deposit the second nanoparticle T-NPs layer on the substrate; and the substrate was taken out and washed to remove unadsorbed nanoparticles.

1.2.4 The steps 1.2.2 and 1.2.3 were repeated, to alternately deposit A-NPs and T-NPs.

Example 2

2.1 Processing of Quantum Dots

According to the scheme of 1.1.1, quantum dots 1, 2, 3 were modified by using ligands containing A, T, G, C, X, and Y bases, to correspondingly obtain a quantum dot layer 1-9 of the A-NPs 1, a quantum dot layer 1-8 of the T-NPs 1, a quantum dot layer 1-7 of the G-NPs 2, a quantum dot layer 1-6 of the C-NPs 2, a quantum dot layer 1-5 of the X-NPs 3, and a quantum dot layer 1-4 of the Y-NPs 3.

Figure 4:
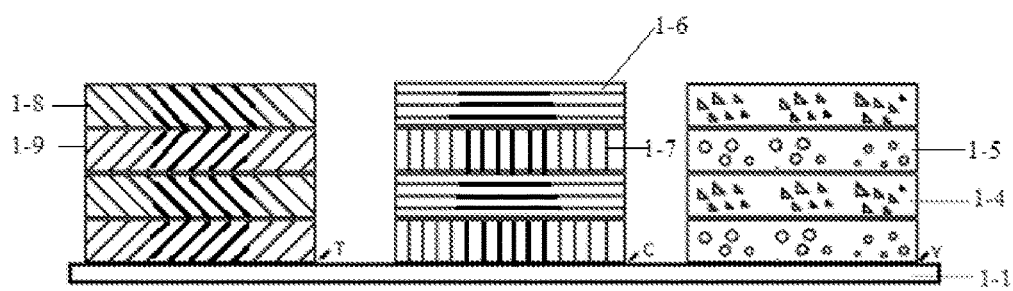
FIG. 4 is a schematic view showing the forming the quantum dot layer in different predetermined areas according to an embodiment of the present disclosure.

2.2 Processing and Depositing of Substrate 2.2.1 Different predetermined areas of the substrate were modified with bases containing T, C, and Y, by a printing process, a transferring process, an exposing process and other processes, respectively;

2.2.2 A-NPs were coated on the modified substrate, and a quantum dot layer of the A-NPs was formed in the T modified predetermined area by self-assembling;

2.2.3 T-NPs were coated on the substrate, and T-NPs continued to be deposited on the surface of A-NPs;

2.2.4 The two steps 2.2.2 and 2.2.3 were repeated to form a quantum dot layer of the NPs 1 in the T modified predetermined area, in which no quantum dots were deposited at the C- and Y-modified position;

2.2.5 A quantum dot layer 1-7 of the G-NPs 2, a quantum dot layer 1-6 of the C-NPs 2, a quantum dot layer 1-5 of the X-NPs 3, and a quantum dot layer 1-4 of the Y-NPs 3 were alternately coated according to the above steps, to obtain the structure in FIG. 4.

Example 3

3.1 Processing of Quantum Dots 3.1.1 The ligand containing adenine (A) was mixed with a quantum dot solution, stirred, precipitated and centrifuged, to obtain adenine modified quantum dots (A-NPs);

3.1.2 The ligand containing thymine (T) was mixed with a quantum dot solution, stirred, precipitated and centrifuged, to obtain thymine modified quantum dots (T-NPs).

3.2 Processing and Depositing of Substrate 3.2.1 30 mg/mL of a solution containing zinc oxide quantum dots were coated at 2000 rpm on a QLED substrate containing a pixel structure, annealed at 100° C. for 30 min, to obtain a zinc oxide film layer.

A solution (0.5 mmol/L) containing 1H,1H,2H,2H-perfluorododecyltrichlorosilane was printed on the desired pixel, stood for 10 min, and rinsed with toluene, to obtain a substrate containing $C_8F_{17}$ group.

The compound containing the base T and the $C_8F_{17}$ group was dissolved in the solution (1 mg/mL), and the substrate was immersed therein at room temperature for 10 min, to obtain a base T modified substrate.

3.2.2 A solution (5 mg/mL) containing base A quantum dots was spin-coated on the base T modified substrate, stood for 5 min at room temperature, and washed to remove the unadsorbed quantum dots, thereby obtaining a patterned A quantum dot film layer.

3.2.3 A solution (5 mg/mL) of T quantum dot solution was spin-coated, stood for 5 min at room temperature, and cleaned to obtain a double-layer film structure containing A-T;

3.2.4 The above steps were repeated for several times, to obtain a multi-layer film structure.

The quantum dot layer formed by the present disclosure was tested, and the resolution of the quantum dot layer can reach 1000 ppi or more. The resolution of the quantum dot layer formed by conventional inkjet printing is generally 300 ppi.

The description of the above Examples is merely used for helping to understand the method according to the present disclosure and its core idea. It should be noted that a person skilled in the art may make further improvements and modifications to the disclosure without departing from the principle/spirit of the present disclosure, and these improvements and modifications shall also fall within the scope of the present disclosure.

The above description of the disclosed Examples allows one skilled in the art to implement or use the present disclosure. Various modifications to these Examples would be apparent to one skilled in the art, and the general principles defined herein may be applied to other Examples without departing from the spirit or scope of the disclosure. Therefore, the present disclosure will not be limited to the Examples shown herein, but should conform to the widest scope consistent with the principles and novel features disclosed herein.

The invention claimed is:

1. A method for patterning a nanoparticle layer, comprising steps of:
   (S1) connecting a first base to a surface of a predetermined area of a substrate, to form a substrate modified with the first base in the predetermined area of the substrate;
   (S2) depositing nanoparticles in the predetermined area of the substrate, to form a nanoparticle layer in the predetermined area of the substrate by self-assembling, a ligand of the nanoparticles comprising a second base, and the first base and the second base being connected by a hydrogen bond; and
   (S3) removing the nanoparticles in a non-predetermined area of the substrate.

2. The method of claim 1, wherein the step (S1) comprises:
   connecting a compound containing the first base to the predetermined area of the substrate by a printing process, a roll to roll process or a transferring process, to form a substrate modified with the first base in the predetermined area of the substrate.

3. The method of claim 1, wherein the step (S1) comprises:
   connecting a compound containing the first base to the entire surface of the substrate by a coating process or an immersing process, and then removing the first base connected to the non-predetermined area of the substrate by ultraviolet irradiation, to form the substrate modified with the first base in the predetermined area of the substrate.

4. The method of claim 1, wherein the step (S3) comprises: removing the nanoparticles in the non-predetermined area of the substrate by using a solvent of the nanoparticles.

5. The method of claim 1, wherein the step (S3), after removing the nanoparticles in the non-predetermined area of the substrate, further comprises:
   depositing a plurality of nanoparticle layers in sequence in a predetermined area, different nanoparticle layers being connected by a hydrogen bond.

6. The method of claim 1, wherein the nanoparticle layer is a quantum dot layer.

7. The method of claim 6, wherein the method comprises:
   forming a substrate modified with the first base in a first predetermined subarea of the substrate by a printing process, a roll to roll process or a transferring process;
   depositing a first quantum dot on the substrate, to form a first quantum dot layer in the first predetermined subarea of the substrate, a ligand of the first quantum dot comprising a second base, and the first base and the second base being connected by a hydrogen bond;
   removing the first quantum dot in the non-predetermined area of the substrate;
   forming a substrate modified with a third base in a second predetermined subarea of the substrate by a printing process, a roll to roll process or a transferring process;

depositing a second quantum dot on the substrate to form a second quantum dot layer in the second predetermined subarea of the substrate, a ligand of the second quantum dot comprising a fourth base, and the third base and the fourth base being connected by a hydrogen bond; and removing the second quantum dot in the non-predetermined area of the substrate.

8. The method of claim 7, wherein a color of light emitted by the first quantum dot is different from a color of light emitted by the second quantum dot.

9. The method of claim 8, wherein the method further comprises:

forming a substrate modified with a fifth base in a third predetermined subarea of the substrate by a printing process, a roll to roll process or a transferring process;

depositing a third quantum dot on the substrate to form a third quantum dot layer in the third predetermined subarea of the substrate, a ligand of the third quantum dot comprising a sixth base, and the fifth base and the sixth base being connected by a hydrogen bond;

removing the third quantum dot in the non-predetermined area of the substrate.

10. The method of claim 9, wherein a color of light emitted by the third quantum dot is different from the color of the light emitted by the first quantum dot and the color of the light emitted by the second quantum dot.

11. The method of claim 10, wherein the first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

12. The method for preparing a quantum dot light emitting device, wherein the quantum dot layer is prepared by the method of claim 1.

13. The method of claim 12, wherein the method further comprises:

forming an anode on the substrate;

forming a hole transport layer modified with a first base on the anode, the first base being connected to a surface of a predetermined area of the hole transport layer away from the anode;

depositing a quantum dot on the hole transport layer, a second group in a predetermined area of the hole transport layer being combined with the quantum dot, a ligand of the quantum dot comprising a second base, and the first base and the second base being connected by a hydrogen bond;

removing the quantum dot in the non-predetermined area of the substrate, to form a patterned quantum dot layer;

forming an electron transport layer on the quantum dot layer; and forming a cathode on the electron transport layer.

14. The method of claim 12, wherein the method further comprises:

forming a cathode on the substrate;

forming an electron transport layer modified with a first base on the cathode, the first base being connected to a surface of a predetermined area of the electron transport layer away from the cathode;

depositing a quantum dot on the electron transport layer, a second group in a predetermined area of the electron transport layer being combined with the quantum dot, a ligand of the quantum dot comprising a second base, and the first base and the second base being connected by a hydrogen bond;

removing the quantum dot in the non-predetermined area of the substrate, to form a patterned quantum dot layer;

forming a hole transport layer on the quantum dot layer; and forming an anode on the hole transport layer.

15. A quantum dot light emitting device, comprising:

a substrate having a first predetermined area;

a first base connected to a surface of the first predetermined area of the substrate; and a first quantum dot layer comprising a second base, the first base and the second base being connected by a hydrogen bond.

16. The quantum dot light emitting device of claim 15, wherein the first predetermined area of the substrate has hydroxyl group.

17. The quantum dot light emitting device of claim 15, wherein the substrate comprises a hole transport layer, a surface of the hole transport layer proximate to the first quantum dot layer has hydroxyl group.

18. The quantum dot light emitting device of claim 16, wherein the compound containing the first base further comprises at least one of amino group, carboxyl group, polyamino group, and polycarboxyl group.

19. The quantum dot light emitting device of claim 15, wherein the first base and the second base are selected from any one of A, T, G, C, dNam, d5SICS, and the first base and the second base are connected by a hydrogen bond.

20. The quantum dot light emitting device of claim 15, wherein the quantum dot light emitting device further comprises:

a substrate having a second predetermined area;

a third base connected to a surface of the second predetermined area of the substrate;

a second quantum dot layer comprising a fourth base, the third base and the fourth base being connected by a hydrogen bond;

a substrate having a third predetermined area;

a fifth base connected to the surface of the third predetermined area of the substrate; and a third quantum dot layer comprising a sixth base, the fifth base and the sixth base being connected by a hydrogen bond, wherein a color of light emitted by the first quantum dot, a color of light emitted by the second quantum dot and a color of light emitted by the third quantum dot are different from each other, the first base, the second base, the third base, the fourth base, the fifth base, and the sixth base are independently selected from any one of A, T, G, C, dNam, and d5SICS; and the first base and the second base are capable of being connected by a hydrogen bond, the third base and the fourth base are capable of being connected by a hydrogen bond, and the fifth base and the sixth base are capable of being connected by a hydrogen bond.

* * * * *